US011289836B2

(12) United States Patent
O'Connell et al.

(10) Patent No.: US 11,289,836 B2
(45) Date of Patent: Mar. 29, 2022

(54) LAND GRID ARRAY ELECTRICAL CONTACT COATING

(71) Applicant: International Business Machines Corporation, Armonk, NY (US)

(72) Inventors: Kevin O'Connell, Rochester, MN (US); Mark K. Hoffmeyer, Rochester, MN (US); Matthew Doyle, Chatfield, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/936,476

(22) Filed: Jul. 23, 2020

(65) Prior Publication Data

US 2022/0029326 A1    Jan. 27, 2022

(51) Int. Cl.
*H01R 12/71* (2011.01)
*H01R 13/03* (2006.01)
*H01R 43/16* (2006.01)
*H01R 43/20* (2006.01)
*H01R 13/24* (2006.01)
*H01R 12/70* (2011.01)

(52) U.S. Cl.
CPC ........... *H01R 12/714* (2013.01); *H01R 13/03* (2013.01); *H01R 13/24* (2013.01); *H01R 43/16* (2013.01); *H01R 43/20* (2013.01); *H01R 12/707* (2013.01)

(58) Field of Classification Search
CPC .. H01R 9/2491; H01R 12/714; H01R 12/707; H01R 13/03; H01R 13/24; H01R 43/16; H01R 43/20
USPC ........................................................ 439/626
See application file for complete search history.

(56) References Cited

U.S. PATENT DOCUMENTS

| | | | |
|---|---|---|---|
| 4,668,041 A | 5/1987 | La Komski | |
| 5,089,881 A | 2/1992 | Panicker | |
| 5,106,308 A | 4/1992 | Gollomp | |
| 5,380,210 A * | 1/1995 | Grabbe | H01R 13/2435 439/66 |
| 5,427,535 A * | 6/1995 | Sinclair | H01R 13/2414 439/66 |
| 6,231,353 B1 * | 5/2001 | Rathburn | H01R 13/2414 439/66 |

(Continued)

FOREIGN PATENT DOCUMENTS

| | | |
|---|---|---|
| CN | 208861976 U | 5/2019 |
| JP | 2013026174 A | 2/2013 |

OTHER PUBLICATIONS

"Dielectric Materials," Capacitor Guide, accessed Jul. 2, 2020, 4 pages. <http://www.capacitorguide.com/dielecliic-materials/>.

(Continued)

*Primary Examiner* — Peter G Leigh
(74) *Attorney, Agent, or Firm* — Brian D. Welle

(57) ABSTRACT

An land grid array (LGA) or hybrid land grid array (HLGA) includes a socket housing and a plurality of electrical contacts. The socket housing is made of a first material that defines a first dielectric constant. The plurality of electrical contacts extends through the socket housing to electrically couple a printed circuit board on a first side of the socket housing to a processor on a second side of the socket housing. A coating of a second material that defines a second dielectric constant that is higher than the first dielectric constant covers surfaces of a subset of the plurality of electrical contacts.

20 Claims, 8 Drawing Sheets

(56) References Cited

U.S. PATENT DOCUMENTS

| | | | |
|---|---|---|---|
| 6,409,521 B1 * | 6/2002 | Rathburn | H01R 13/2435 439/66 |
| 6,496,355 B1 | 12/2002 | Galvagni | |
| 6,869,290 B2 | 3/2005 | Brown | |
| 6,936,917 B2 | 8/2005 | Lopata | |
| 6,945,788 B2 * | 9/2005 | Trout | H05K 7/1069 439/66 |
| 6,957,963 B2 * | 10/2005 | Rathburn | H01L 23/49811 257/E23.067 |
| 7,128,580 B2 * | 10/2006 | Liao | H01R 13/2435 439/71 |
| 7,225,538 B2 | 6/2007 | Eldridge | |
| 7,331,796 B2 * | 2/2008 | Hougham | H05K 3/326 439/66 |
| 7,445,465 B2 * | 11/2008 | Lopez | G01R 1/0466 439/72 |
| 7,695,288 B2 * | 4/2010 | Ma | H01R 43/20 439/70 |
| 7,959,466 B2 * | 6/2011 | Ju | H01R 13/2442 439/607.03 |
| 8,025,531 B1 * | 9/2011 | Zhang | H01R 13/6588 439/607.05 |
| 8,079,872 B2 * | 12/2011 | Ju | H01R 13/6599 439/607.03 |
| 8,179,693 B2 * | 5/2012 | Brodsky | H01R 12/52 361/803 |
| 8,199,458 B2 | 6/2012 | Oh | |
| 8,535,093 B1 * | 9/2013 | Mason | H01R 13/6585 439/607.05 |
| 8,821,192 B2 * | 9/2014 | Chang | H01R 13/646 439/630 |
| 8,851,904 B2 * | 10/2014 | Chang | H05K 7/10 439/71 |
| 8,911,266 B2 * | 12/2014 | Kawate | H01R 13/6596 439/700 |
| 8,932,080 B2 * | 1/2015 | Chang | H01R 12/52 439/607.1 |
| 9,172,161 B2 * | 10/2015 | Walden | H01R 13/2435 |
| 9,178,328 B2 * | 11/2015 | Heppner | H01L 21/50 |
| 9,184,527 B2 * | 11/2015 | Rathburn | H01R 43/20 |
| 9,559,447 B2 * | 1/2017 | Rathburn | H01R 12/7082 |
| 9,780,510 B2 * | 10/2017 | Athreya | H01L 23/49827 |
| 9,876,307 B2 * | 1/2018 | Wagman | H01R 13/08 |
| 9,882,296 B1 * | 1/2018 | Ju | H01R 13/432 |
| 9,899,757 B2 * | 2/2018 | Do | H01R 13/08 |
| 10,027,061 B2 * | 7/2018 | Avery | H01R 13/405 |
| 10,135,162 B1 * | 11/2018 | Hejase | H01R 12/7076 |
| 10,205,292 B2 * | 2/2019 | Athreya | H01L 23/32 |
| 10,547,136 B2 * | 1/2020 | Ho | H01R 12/714 |
| 2002/0192994 A1 * | 12/2002 | Turner | H01R 13/193 439/342 |
| 2012/0220169 A1 * | 8/2012 | Uozumi | H01R 12/73 439/660 |
| 2015/0372425 A1 * | 12/2015 | Fazelpour | H01R 43/205 439/660 |
| 2016/0028203 A1 * | 1/2016 | Heppner | H01R 13/245 29/876 |
| 2018/0184517 A1 | 6/2018 | Cantin | |
| 2019/0089098 A1 * | 3/2019 | Cheng | H01R 4/02 |

OTHER PUBLICATIONS

Anonymous, "Method for a full grid socket using IDC capacitors," IP.com, Disclosure No. IPCOM000145861D, Jan. 30, 2007, 6 pages. <https://priorart.ip.com/IPCOM/000145861>.

Anonymous, "Method for an array capacitors with optimized LGA or bar-style terminations," IP.com, Disclosure No. IPCOM000135647D, Apr. 20, 2006, 6 pages. <https://priorart.ip.com/IPCOM/000135647>.

Anonymous, "Method for direct chip attachment using thin-film capacitor technology," IP.com, Disclosure No. IPCOM000101708D, Mar. 16, 2005, 5 pages. <https://ip.com/IPCOM/000101708>.

* cited by examiner

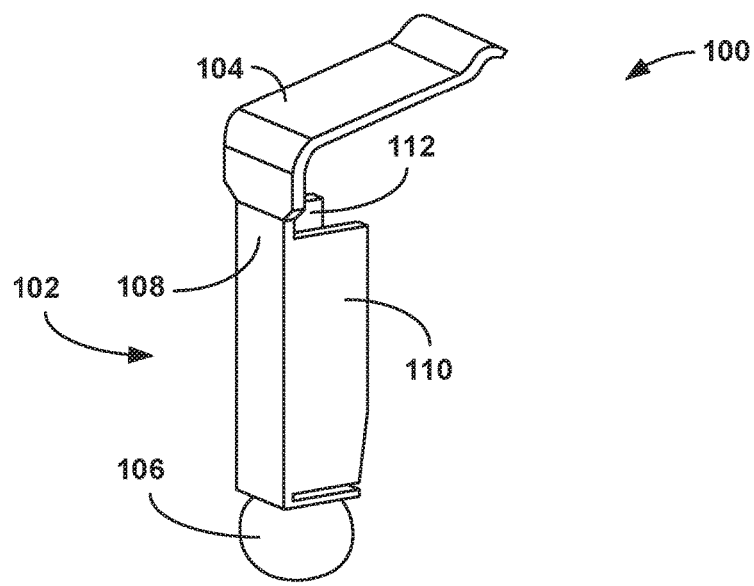
FIG. 1A
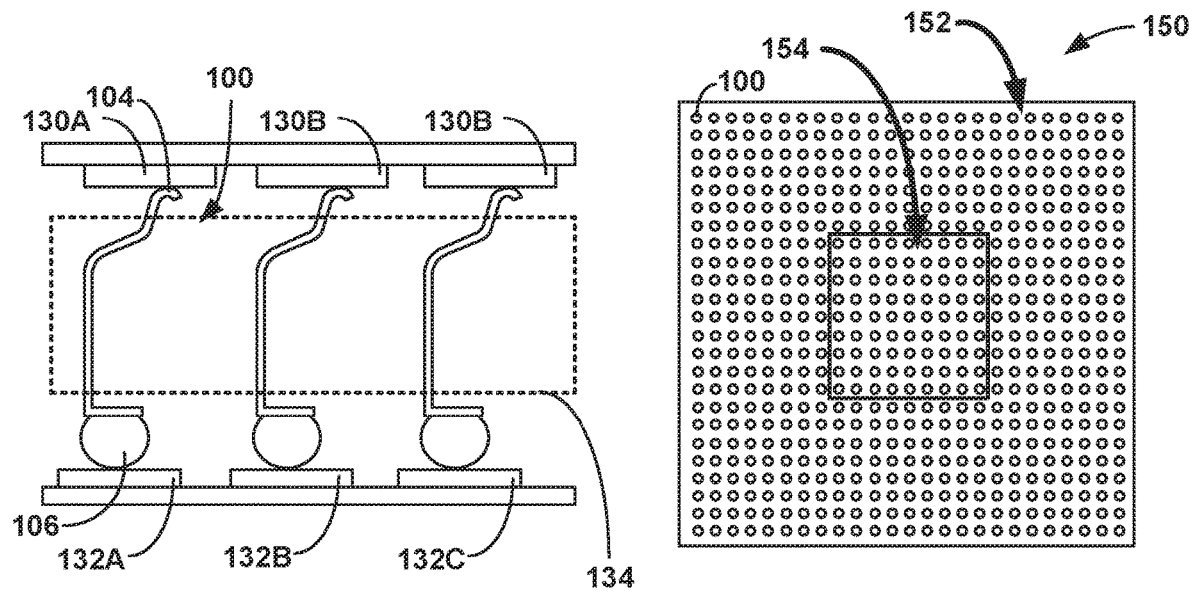
FIG. 1B
FIG. 1C

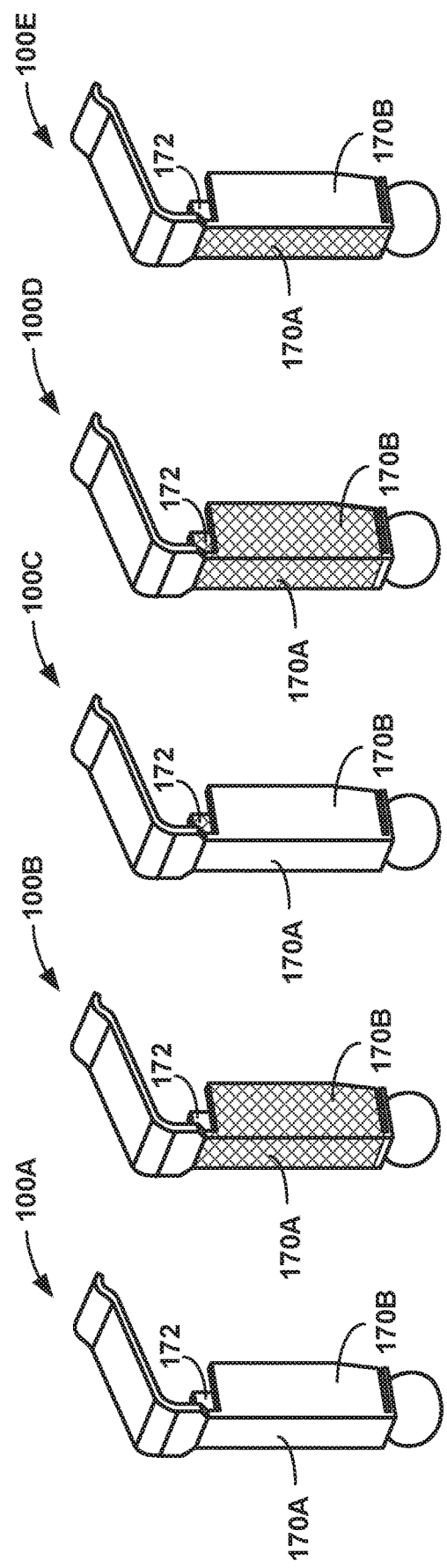

500A

| LGA plate width (mils) | Total LGA plate width (mils) | LGA height (d) (mils) | Area (mils) | A/d | Ea*Eo | C |
|---|---|---|---|---|---|---|
| 100 | 300 | 63 | 18900 | 0.00762 | 8.85E-09 | 6.75E-11 |
| 60 | 180 | 63 | 11340 | 0.004572 | 8.85E-09 | 4.05E-11 |
| 40 | 120 | 63 | 7560 | 0.003048 | 8.85E-09 | 2.70E-11 |
| 20 | 60 | 63 | 3780 | 0.001524 | 8.85E-09 | 1.35E-11 |
| 12 | 36 | 63 | 2268 | 0.000914 | 8.85E-09 | 8.10E-12 |
| 12 | 36 | 63 | 2268 | 0.000914 | 8.85E-09 | 8.10E-12 |
| 12 | 36 | 63 | 2268 | 0.000914 | 8.85E-09 | 8.10E-12 |
| 10 | 30 | 63 | 1890 | 0.000762 | 8.85E-09 | 6.75E-12 |
| 10 | 30 | 63 | 1890 | 0.000762 | 8.85E-09 | 6.75E-12 |
| 8 | 24 | 63 | 1512 | 0.00061 | 8.85E-09 | 5.40E-12 |
| 6 | 18 | 63 | 1134 | 0.000457 | 8.85E-09 | 4.05E-12 |

500B

| LGA plate width (mils) | Total LGA plate width (mils) | LGA height (d) (mils) | Area (mils) | A/d | Ea*Eo | C |
|---|---|---|---|---|---|---|
| 100 | 300 | 63 | 18900 | 0.00762 | 2.66E-08 | 2.02E-10 |
| 60 | 180 | 63 | 11340 | 0.004572 | 2.66E-08 | 1.21E-10 |
| 40 | 120 | 63 | 7560 | 0.003048 | 2.66E-08 | 8.10E-11 |
| 20 | 60 | 63 | 3780 | 0.001524 | 2.66E-08 | 4.05E-11 |
| 12 | 36 | 63 | 2268 | 0.000914 | 2.66E-08 | 2.43E-11 |
| 12 | 36 | 63 | 2268 | 0.000914 | 2.66E-08 | 2.43E-11 |
| 12 | 36 | 63 | 2268 | 0.000914 | 2.66E-08 | 2.43E-11 |
| 10 | 30 | 63 | 1890 | 0.000762 | 2.66E-08 | 2.02E-11 |
| 10 | 30 | 63 | 1890 | 0.000762 | 2.66E-08 | 2.02E-11 |
| 8 | 24 | 63 | 1512 | 0.00061 | 2.66E-08 | 1.62E-11 |
| 6 | 18 | 63 | 1134 | 0.000457 | 2.66E-08 | 1.21E-11 |

500C

| LGA plate width (mils) | Total LGA plate width (mils) | LGA height (d) (mils) | Area (mils) | A/d | Ea*Eo | C |
|---|---|---|---|---|---|---|
| 100 | 300 | 63 | 18900 | 0.00762 | 6.20E-08 | 4.72E-10 |
| 60 | 180 | 63 | 11340 | 0.004572 | 6.20E-08 | 2.83E-10 |
| 40 | 120 | 63 | 7560 | 0.003048 | 6.20E-08 | 1.89E-10 |
| 20 | 60 | 63 | 3780 | 0.001524 | 6.20E-08 | 9.45E-11 |
| 12 | 36 | 63 | 2268 | 0.000914 | 6.20E-08 | 5.67E-11 |
| 12 | 36 | 63 | 2268 | 0.000914 | 6.20E-08 | 5.67E-11 |
| 12 | 36 | 63 | 2268 | 0.000914 | 6.20E-08 | 5.67E-11 |
| 10 | 30 | 63 | 1890 | 0.000762 | 6.20E-08 | 4.72E-11 |
| 10 | 30 | 63 | 1890 | 0.000762 | 6.20E-08 | 4.72E-11 |
| 8 | 24 | 63 | 1512 | 0.00061 | 6.20E-08 | 3.78E-11 |
| 6 | 18 | 63 | 1134 | 0.000457 | 6.20E-08 | 2.83E-11 |

FIG. 8

LAND GRID ARRAY ELECTRICAL CONTACT COATING

BACKGROUND

Within modern computer design, components are increasingly modular, such that most and/or each of the individual components within computers may be individually replaced and/or upgraded over time. Part of this modularity is provided by various sockets that define a manner in which components are electrically and/or physically coupled together. For example, central processing unit (CPU) sockets come in a variety of formats. Some primary conventions of CPU sockets are pin grid array (PGA), ball grid array (BGA), and land grid array (LGA) (as well as the subtype of hybrid land grid array (HLGA)).

BGA permanently couples a processor to a motherboard (such that BGA is arguably not a socket, though it is frequently categorized as one for purposes of identification), therein reducing cost but functionally eliminating the chance of upgrading the processor over time. Assemblies that utilize PGA sockets have pins on the processor itself which are inserted into respective holes of the PGA socket. LGA sockets may be thought of as an inverse of PGA sockets, where the pins are internal to the LGA socket rather than external when in a disassembled state. Specifically, LGA sockets have pins within a socket housing, where the pins have springs on both ends, one of which is coupled to the processor and the other of which is coupled to the motherboard. HLGA sockets are substantially similar to LGA sockets (such as by having pins within the socket housing) but have a spring on one end and a solder ball on the other end of respective pin. By virtue of having pins contained within the socket housing rather than exposed as required by PGA sockets, LGA and HLGA sockets may be more durable (e.g., as PGA sockets may be damaged by bending or deforming one or more pins during storage or assembly), and further the pins may be fit into a smaller space (such that LGA and HLGA sockets may be easier to make more space efficient than respective PGA sockets).

SUMMARY

Aspects of the present disclosure relate to systems and methods for creating localized capacitance within a land grid array (LGA) and/or hybrid LGA (HLGA). For example, a chip component (e.g., an LGA or HLGA) includes a socket housing. The chip component also includes a plurality of electrical contacts that extend through the socket housing to electrically couple a printed circuit board (PCB) on a first side of the socket housing to a processor on a second side of the socket housing. The chip component also includes a coating of a second material on some surfaces of a subset of the plurality of electrical contacts. This coating may render a dielectric within the socket housing that is adjacent a conductor.

Other aspects of the disclosure relate to a land grid array (LGA) that includes a socket housing made of a first material that defines a first dielectric constant. The LGA also includes a plurality of electrical contacts that extend through the socket housing. The LGA also includes a coating of a second material that defines a second dielectric constant higher than the first dielectric constant that covers a subset of the plurality of electrical contacts such that a localized capacitance of the LGA is increased.

Other aspects of the disclosure relate to a method of creating localized capacitance within a LGA. The method includes extruding a sheet of a conductive material that defines a first dielectric constant. The method also includes applying a coating that defines a second dielectric constant higher than the first constant to some portion of the sheet. The method also includes cutting a plurality of shapes from the sheet such that the coating is on some surfaces of the shapes. The method also includes folding the shapes into the plurality of electrical contacts. The method also includes assembling the plurality of electrical contacts into a socket housing of a land grid array (LGA) such that each of the plurality of electrical contacts extend through the socket housing and a localized capacitance of the chip component is increased due to the coating on some surfaces of the plurality of electrical contacts.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

FIG. 1A depicts an isometric view of an example land grid array electrical connect that may be coated on various sides to create a localized capacitance of the land grid array.

FIG. 1B depicts a conceptual cross-sectional view of a plurality of electrical contacts as extending through a socket housing of a land grid array.

FIG. 1C depicts a conceptual view of a top-down view of a land grid array in which some surfaces of some electrical contacts may be coated to create a localized capacitance.

FIGS. 2A-2E depict different examples of coatings of various surfaces of respective electrical contacts.

FIG. 8 depicts results of calculations regarding adding coating to various surfaces of electrical contacts to create a localized capacitance.

Figure 3:
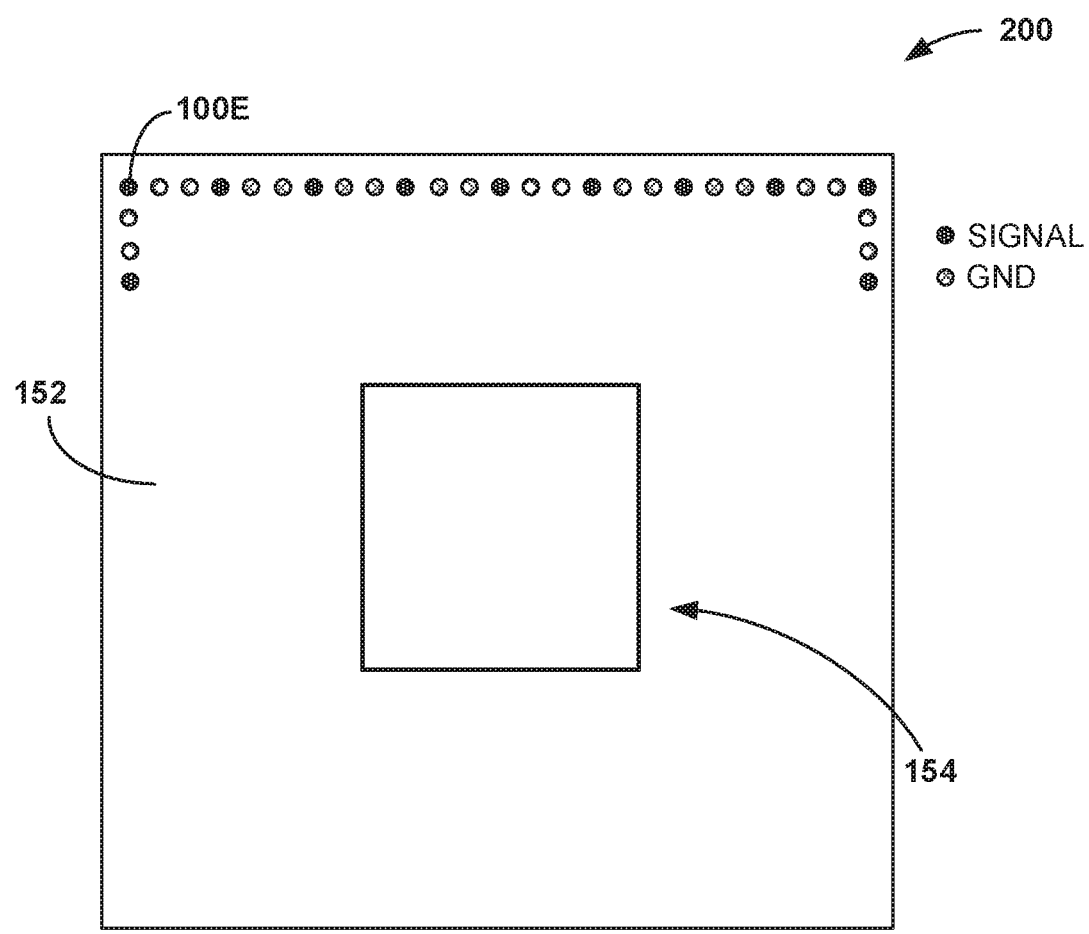
FIG. 3 depicts an example pattern that may be defined by coating some surfaces of some electrical contacts of a land grid array in a way that may compensate for inductance.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to coating select surfaces of at least some electrical contacts of a land grid array (LGA) or hybrid LGA (HLGA) with a coating that defines a higher dielectric constant than a socket housing of the LGA/HLGA, while more particular aspects of the present disclosure relate to generating patterns of coated and uncoated surfaces of respective electrical contacts to create a localized capacitance and therein supplement a property of the LGA/HLGA. While the present disclosure is not necessarily limited to such applications, various aspects of the disclosure may be appreciated through a discussion of various examples using this context.

As modern computers become more robust, processing units of these computers are experiencing increased demands for power, input/out capacity, and the like. To satisfy these demands, processing units may be designed with additional capacitor components to provide decoupling capacitance. At the same time, there is an increasing demand for modern computers to be smaller, and to do more within smaller packages. As such, it is become increasingly difficult to fit a desired number of capacitors on a processing unit such that the processing unit can operate as desired.

This may be further complicated for processing units that utilize printed circuit boards (PCBs), as it may be a requirement that capacitors be placed on a "back" side of the main PCB. Due to capacitators being placed on a back side of the main PCB, the capacitors may be functionally underneath the body of the module. Such configurations may necessitate that the capacitance is located far away from the load of the processing unit, thus requiring more capacitance to compensate, compounding the issue.

Aspects of this disclosure may solve or otherwise address some or all of these problems. For example, aspects of the disclosure may relate to coating some surfaces of some electrical contacts of an LGA or HLGA with a coating that has a higher dielectric constant than a socket housing of the LGA or HLGA. Due to only some surfaces of some electrical contacts of the LGA or HLGA being coated, a localized capacitance is created. Further, aspects of the disclosure relate to coating predetermined surfaces of predetermined electrical contacts to supplement a property of the LGA or HLGA, such as a property to provide parallel capacitance, a property to compensate for inductance, or the like.

Put differently, by adding dielectric material to portions of electrical contacts contained within a socket of an LGA/HLGA, a parallel capacitor array for power pins may be created. Such an array may provide improved performance, and may be configured to provide sufficient parallel capacitance for power decoupling at the load to reduce the total number of capacitor components required. Additionally, or alternatively, this array may provide additional parallel capacitance without adding additional components. Further, by applying dielectric to select contact surfaces, the contact construction may be used to provide additional capacitance between differential signal pairs to improve signal integrity.

For example, FIG. 1A depicts an example electrical contact 100 of an HLGA that may be coated as described herein. Electrical contact 100 includes shaft 102 that extends between spring 104 and solder ball 106, such that electrical contact 100 is for an HLGA (as compared to a different electrical contact that would be for an LGA and would have two springs 104 on either opposing end of shaft 102). The size and relative shape of spring 104 and solder ball 106 are depicted for purposes of illustration only, and other sizes and shapes of spring 104 and solder ball 106 may be used in other embodiments that are consistent with this disclosure. In some examples, each of shaft 102, spring 104, and solder ball 106 may form a single unitary structure, such that each was formed from a single source material. In other examples, one or each of shaft 102, spring 104, and solder ball 106 were formed individually and then fastened together. For example, shaft 102 (and, in some examples, spring 104) may be formed from a single sheet (e.g., such as the sheet 300 of FIG. 6), and solder ball 106 may be attached to shaft 102 (and spring 104) at a later step.

Though HLGAs and electrical contact 100 for an HLGA are depicted and discussed predominantly throughout this disclosure for purposes of clarity, one of ordinary skill in the art would understand substantially all of this disclosure to relate equally to an LGA version of electrical contact 100, such that throughout this disclosure LGA and HLGA (and electrical contacts thereof) can be interpreted as interchange throughout this disclosure (with the understanding that an LGA electrical contact would replace solder ball 106 with a second spring 104)

As discussed herein, surfaces of electrical contact 100 that are coated may be surfaces of shaft 102. Shaft 102 in FIG. 1A has main wall 108 and two side walls 110, 112 extending between spring 104 and solder ball 106. The relative size and shapes of main wall 108 and side walls 110, 112 are provided for purposes of illustration only, as other version of shaft 102 extending between spring 104 and solder ball 106 may be used in other examples. For example, some versions of electrical contact 100 may not include one of side walls 110, 112, and/or some of main wall 108 and/or side walls 110, 112 may be cut out or shaped differently in other examples (e.g., such as shaft 102 being a cylindrical column between solder ball 106 and spring 104).

Electrical contact 100 may be configured to electrically couple one component contacting spring 104 to another component contacting solder ball 106. For example, FIG. 1B depicts three electrical contacts 100 that are each substantially similar to electrical contact 100 of FIG. 1A. Respective springs 104 of each of these electrical contacts 110 may electrically couple first component 130A, 130B, 130C (collectively referred to herein as "first components 130") to second components 132A, 132B, 132C (collectively referred to herein as "second components 132"). In some examples, by coupling first components 130 to second components 132, electrical contacts 100 may effectively couple a chip package (e.g., such as a processor) to a circuit board (e.g., a printed circuit board (PCB) functioning as a motherboard). Though a processor is predominantly described herein as the package that electrical contacts 100 are coupled to a circuit board, LGA and/or HLGA may be used to couple other types of packages to a circuit board in other examples (e.g., memory, graphics processing units, application specific integrated circuits, or the like).

Electrical contacts 100 may be substantially contained within socket housing 134, such that only a terminal end of each electrical contact 100 extends out of socket housing 134 to contact (and therein electrically couple to) first and second components 130, 132. For example, substantially all of shaft 102 of electrical contact 100 may be contained within socket housing 134, such that only some of spring 104 and solder ball 106 extend outside of socket housing 134. Electrical contacts 100 may be nearly fully physically constrained within socket housing 134, such that it is difficult or impossible for any shaft 102 of a respective electrical contact 100 to move within socket housing 134 relative to socket housing 134 (though spring 104 and/or solder ball 106 of a respective electrical contact 100 may be deformed as the respective electrical contact 100 couples together a respective first and second component 130, 132). Further, electrical contacts 100 may each be electrically insulated from each other within socket housing 134, such that, e.g., an electrical impulse between first component 130A and second component 132A does not interfere with an electrical impulse between first component 130B and second component 132B.

A plurality of electrical contacts 100 may be arranged across a full HLGA socket to couple a package to a PCB or the like. For example, FIG. 1C depicts a conceptual top-down view of a plurality of electrical contacts 100 arranged across a top surface of HLGA 150. In some examples, HLGA 150 may be separated into exterior region 152 of socket housing 134 and internal region 154 of socket housing 134. Internal region 154 may be a region in which chip components (e.g., components of a processor) are located when coupled to HLGA 150, this internal region 154 in other examples being referred to as a chip shadow. For example, exterior region 152 may be used to couple data signals from a package to a PCB through HLGA 150, while internal region 154 is used to couple power from the package to the PCB. HLGA 150 may contain any number of electrical contacts 100 that are required to couple a package to a circuit board. The number and arrangement of electrical contacts 100 in FIG. 1C are depicted for purposes of example only, as a different number of electrical contacts 100 arranged differently may be used in other examples.

As discussed herein, different surfaces of electrical contacts 100 may be coated with a coating that defines a higher dielectric constant than a material of socket housing 134. For example, FIGS. 2A-2E depict different examples of coatings for different electrical contacts 100A-100E, each of which may be substantially similar to electrical contact 100 except for a potential coating. For example, in FIG. 2A, no coating exists on any of external surfaces 170A, 170B (collectively referred to herein as "external surfaces 170" and referring to substantially all external surfaces of shaft 102 of electrical contacts 100) or internal surfaces 172 (hereinafter used to refer both to the single depicted internal surface as "internal surface 172" as well as all internal surfaces of shaft 102 of electrical contact as "internal surfaces 172"). As referred to herein, external surfaces 170 of electrical contacts 100 are surfaces that face away from electrical contacts 100 (such that these external faces 170 face other electrical contacts 100), while internal surfaces 172 of electrical contacts 100 are partially enclosed (e.g., partially enclosed by one of walls 110, 112) and/or face inward (e.g., toward other internal surfaces 172). Though only two external surfaces 170 and one internal surface 172 of electrical contacts 100 are explicitly depicted in FIGS. 2A-2E, it is to be understood that electrical contacts 100 include three main external surfaces and three main internal surfaces that are each included within discussions of external surfaces 170 and internal surfaces 172, respectively.

To continue this example, all external surfaces 170 of electrical contact 100B are coated, all internal surfaces 172 of electrical contact 100C are coated, all external and internal surfaces 170, 172 of electrical contact 100D are coated, and a select external surface 170A of electrical contact 100E are coated (though in other examples a select internal surface 172 of electrical contact 100E is coated as described herein). As would be understood in the art (and as discussed below), arranging a plurality of electrical contacts 100 with different surfaces coated in predetermined patterns relative to each other may create localized capacitance and improve one or more properties of HLGA 150.

As described herein, socket housing 134 may be made of any material that is consistent with this disclosure. For example, socket housing 134 may be made of FR-4, liquid crystal polymer (LCP), or the like. In some examples, socket housing 134 may be made of LCP with glass fiber to improve structural properties of socket housing 134. Similarly, the coating on one or more external surface 170 and/or internal surface 172 may be any material that defines a dielectric constant greater than the housing material. For example, the coating may be Barium Titanate (BaTiO3) Titanium Dioxide, Conjugated polymers, Barium Strontium Titanate, or the like.

It should be noted that different coating materials have different values of relative permittivity. Additionally, the relative permittivity of a given material may vary based on various factors, such as temperature and pressure. For example, BaTiO3 can have a relative permittivity in the range of 1000-7000 farads per meter (F/m). Thus, by modulating the relative permittivity and/or the number of coated electrical contacts 100 along with selectively placing the coated electrical contacts 100 as described herein, a wide range of capacitance can be achieved through embodiments of the present disclosure.

Figure 6:
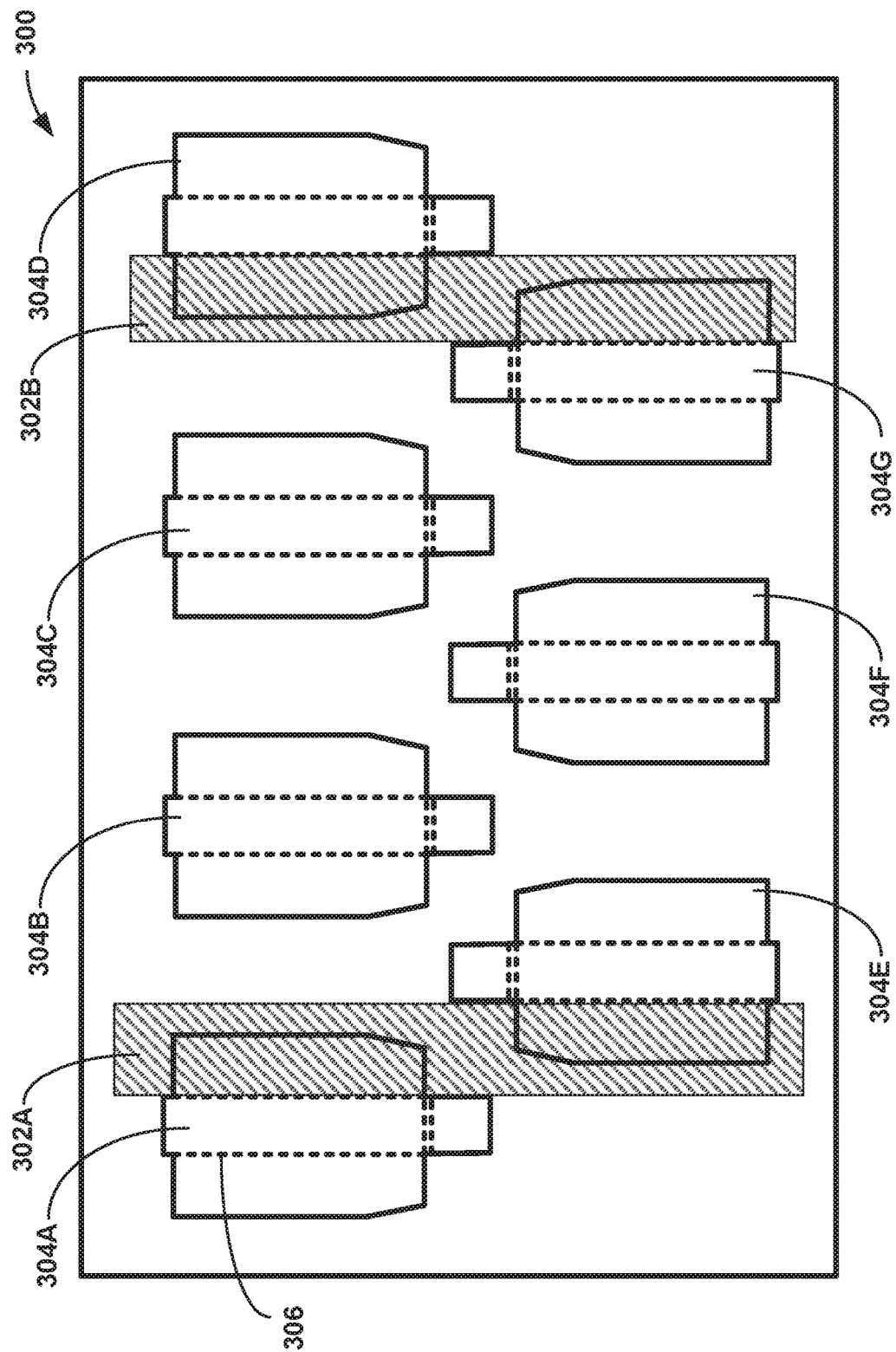
FIG. 6 depicts a conceptual diagram of a sheet of a conductive material that is coated such that only select surfaces of some electrical contacts for a land grid array that will be formed from the sheet are coated.
Figure 7:
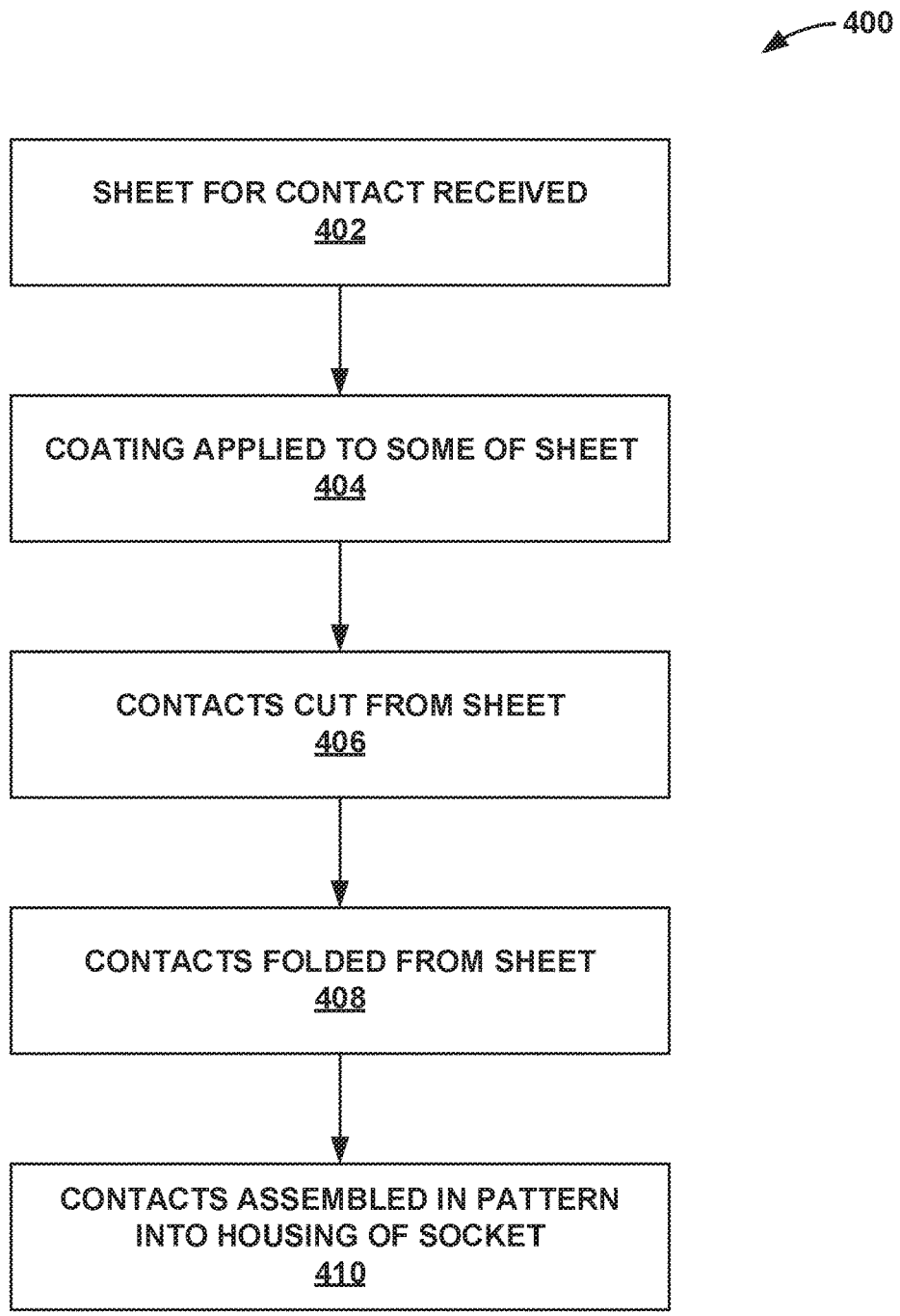
FIG. 7 depicts an example flowchart of a method of manufacture for a land grid array to create a localized capacitance within the land grid array.

This coating may be applied in any way, such as via plasma spray, metal spray, epoxy powder coating, or the like. FIGS. 6 and 7 discuss one particular method of manufacturing HLGA 150 with some surfaces of electrical contacts 100 being coated to define a pattern, though other methods of manufacturing electrical contacts 100 and HLGA 150 that are consistent with this disclosure may be used in other examples.

A subset of electrical contacts 100 that are coated in different ways as described above may define a pattern within socket housing 134 of HLGA 150 to supplement a property of HLGA 150. For example, electrical contacts 100 may be coated and then arranged in such a way to increase overall capacitance of different pairs of electrical contacts 100. This may improve an ability of HLGA 150 to compensate for inductance overall within HLGA 150.

For example, FIG. 3 depicts an example pattern 200 of electrical contacts 100 that compensates for inductance in this way. It is to be noted that only a subset of electrical contacts 100 are depicted in FIG. 3 for purposes of illustration, but that more electrical contacts 100 can be included, such as depicted in FIG. 1. In the example pattern 200 of FIG. 3, the subset of coated electrical contacts 100 are each similar to electrical contact 100E. For example, each electrical contact 100E of pattern 200 includes only one or a select few surfaces that are coated, whether external surface(s) 170 or internal surface(s) 172. As depicted in FIG. 3, pattern 200 may include electrical contacts 100E in an orthogonal pattern with every $3^{rd}$ electrical contact 100E being a signal, and the two in between signal electrical contacts 100E being ground electrical contacts 100E, thus creating an orthogonal array. Alternatively, electrical contacts 100E could be arranged in a similar hexagonal array (e.g., similar to what is depicted, but with signal electrical contacts 100E defining an angle of 120° rather than 90° as they extend away from a respective ground electrical contact 100E). Though no standard (i.e., uncoated) electrical contacts 100A are depicted for purposes of illustration, and though pattern 200 only depicts electrical contacts 100E extending around a portion of exterior region 152, in other examples standard uncoated electrical contacts 100A may proliferate "the rest" of HLGA 150, and pattern 200 may extend around the rest of HLGA 150. As would be understood by one of ordinary skill in the art, the specific number and arrangement of electrical contacts 100 may vary and relate to the specific application needs (e.g., as may be set by which package is being coupled to the respective PCB by the respective HLGA 150).

Figure 4A:
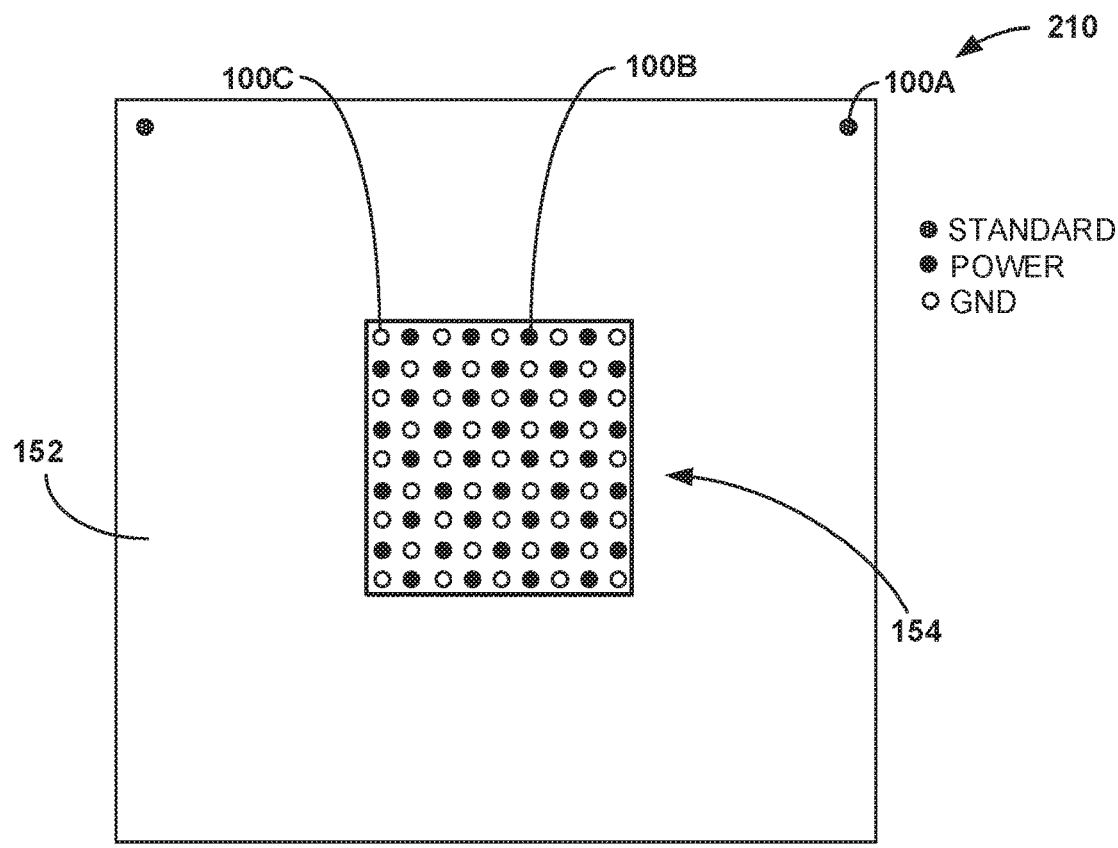
FIGS. 4A and 4B depict example patterns that may be defined by coating select surfaces of some electrical contacts of a land grid array in a way that may provide additional capacitance.
Figure 4B:
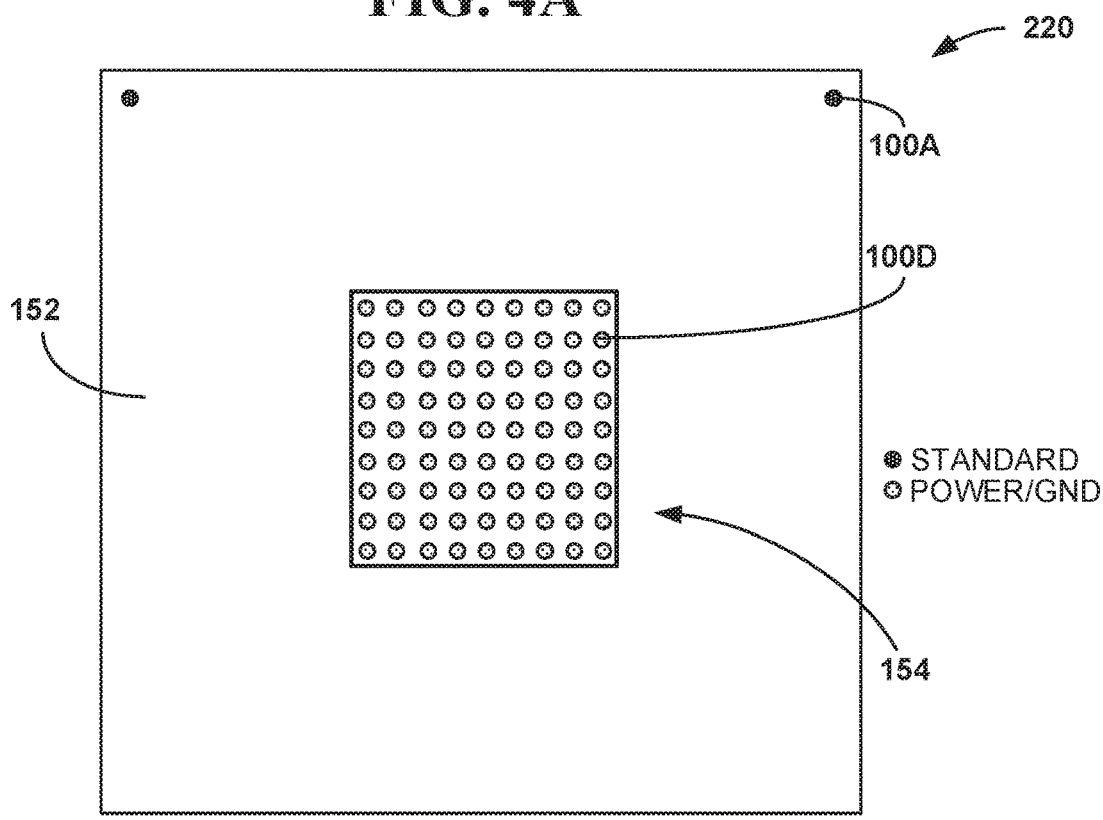

In other examples, electrical contacts 100 may be coated and then arranged in such a way as to provide additional parallel capacitance within electrical contacts 100. For example, FIGS. 4A-4B depicts example patterns 210, 220 of electrical contacts 100 that provide additional parallel capacitance. It is to be understood that only a subset of electrical contacts are depicted for purposes of explanation in FIGS. 4A-4B. Specifically, pattern 210 of FIG. 4A defines alternating between electrical contacts 100B with coated external faces 170 and electrical contacts 100C with coated internal faces 172. As depicted, electrical contacts 100 may alternate between electrical contact 100B and electrical contact 100C within internal region 154. As depicted, electrical contacts 100B may provide power, while electrical contacts 100A provide ground. HLGA 150 may otherwise include standard electrical contacts 100A in exterior region 152 in any manner consistent with this disclosure to otherwise satisfy the needs of HLGA 150.

Alternatively, FIG. 4B depicts pattern 220 in which electrical contacts 100 in exterior region 152 are standard 100A, and all electrical contacts 100 in internal region 154 are electrical contacts 100D with coated external faces 170 and coated internal faces 172 (e.g., such that any electrical contacts 100D within internal region 154 can be provided with either a power or a ground). Though only four standard electrical contacts 100A are depicted in FIGS. 4A and 4B for purposes of illustration, HLGA 150 may include any number of standard electrical contacts 100A in exterior region 152 in any arrangement consistent with this disclosure to satisfy the requirements of HLGA 150 in coupling a package to a circuit board.

Figure 5A:
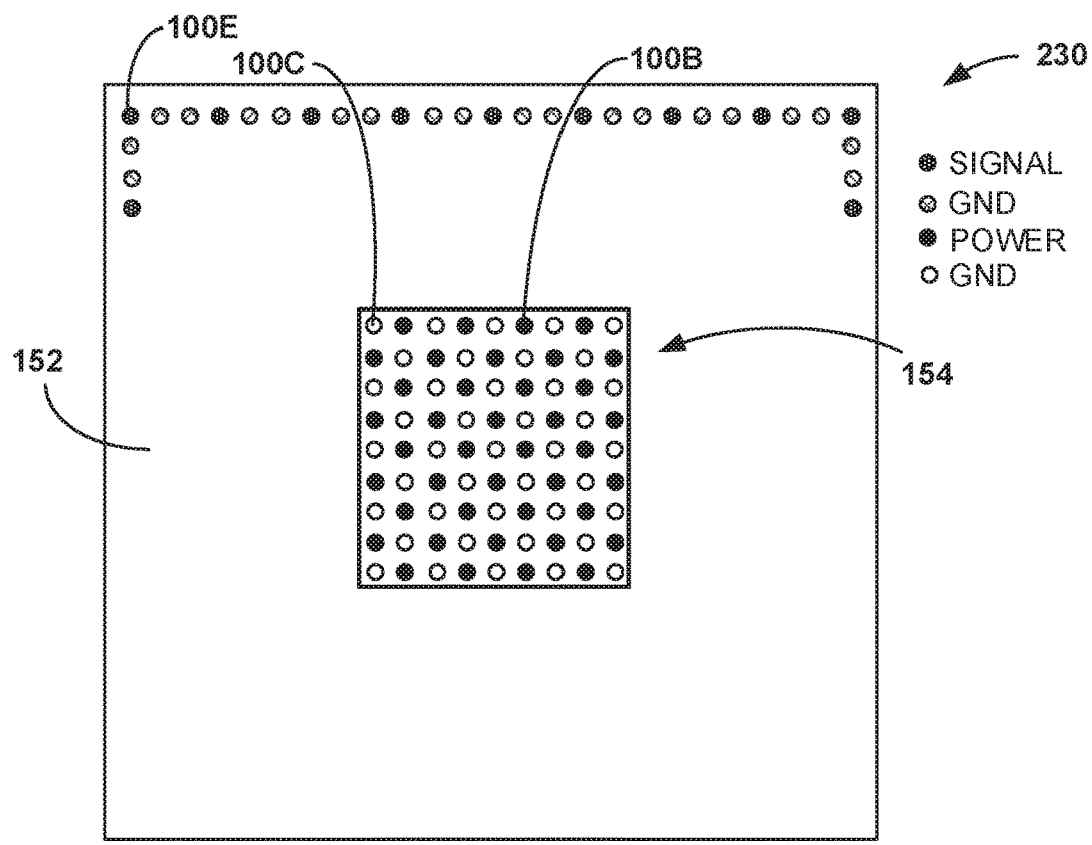
FIGS. 5A and 5B depict example patterns that may be defined by coating selected surfaces of some electrical contacts of a land grid array in a way that may both provide additional capacitance and to compensate for inductance.
Figure 5B:
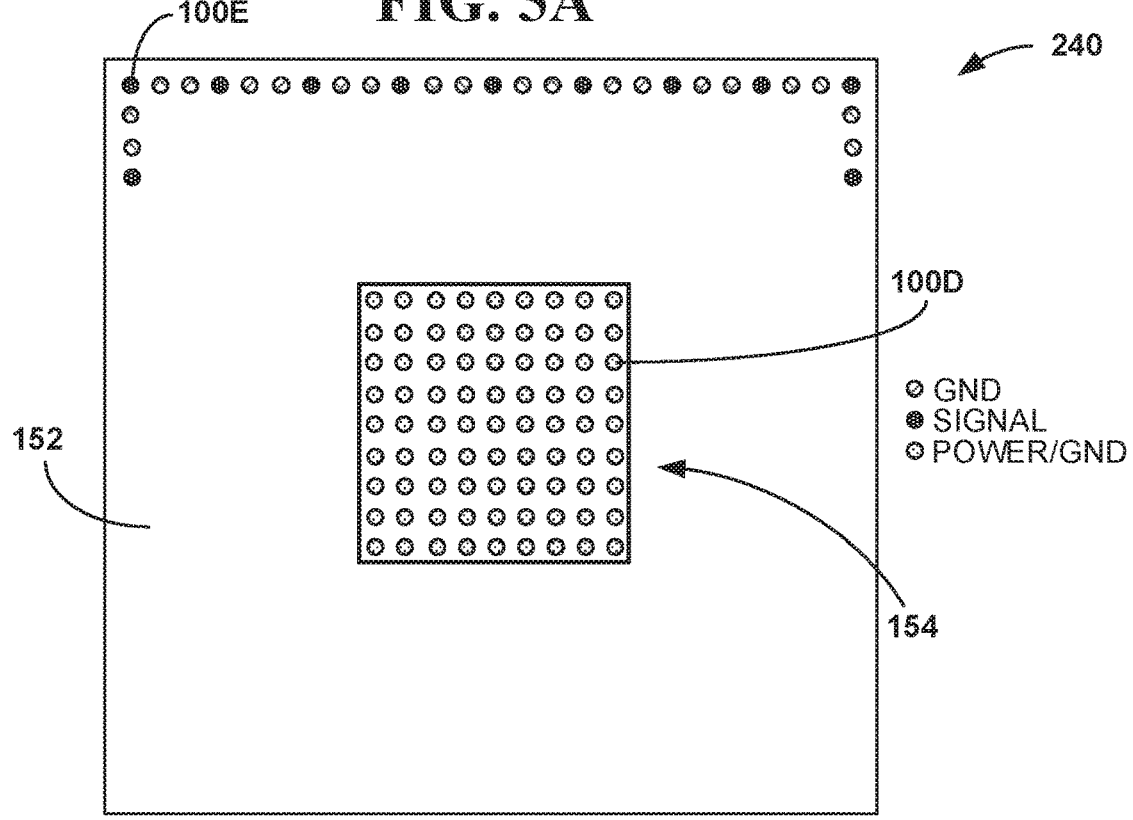

In certain examples, electrical contacts 100 may be coated and then arranged in such a way to supplement multiple properties of HLGA 150. For example, FIGS. 5A-5B depicts example patterns 230, 240 of electrical contacts 100 that both provide additional parallel capacitance and also compensate for inductance as described herein. It is to be noted that in FIGS. 5A and 5B, only a subset of the electrical contacts 100 are depicted for purposes of explanation. Electrical contacts 100 may define patterns 230, 240 that do both by merging numerous patterns that, independently, may supplement a single property of HLGA 150.

Specifically, as depicted in FIGS. 5A-5B, both patterns 230, 240 may include electrical contacts 100E defining an orthogonal pattern with every $3^{rd}$ electrical contact 100E being a signal and other electrical contacts 100E providing the ground to create an orthogonal array (e.g., similar to the orthogonal array of FIG. 3). As depicted, patterns 230, 240 may include such an orthogonal array in exterior region 152.

Further, pattern 230 of FIG. 5A defines an alternating pattern (e.g., as from pattern 210 of FIG. 4A) between electrical contacts 100B with coated external faces 170 and electrical contacts 100C with coated internal faces 172 within internal region 154, where electrical contacts 100B provide power and electrical contacts 100A provide ground. Alternatively, FIG. 5B depicts pattern 230 in which all electrical contacts 100 in internal region 154 are electrical contacts 100D with coated external faces 170 and coated internal faces 172, as in pattern 220 of FIG. 4B. By mixing patterns in this way, electrical contacts 100 may be configured to supplement multiple properties of HLGA 150.

Electrical contacts 100 may be created and coated in any way that is consistent with this disclosure. Some methods of manufacturing electrical contacts 100 may result in a more predictable uniform coat of the dielectric material across the intended surface as described herein. For example, if a coating is not applied until after electrical contacts 100 are in a final shape (e.g., a shape similar to what is depicted in FIG. 1A), then it may be difficult to apply an even coating to some surfaces such as internal surfaces 172 without wasting some of the material (e.g., by "overcoating" these surfaces). As such, aspects of the disclosure relate to using an sheet of a conductive material to form electrical contacts 100, and applying a coating to one or both sides of this sheet prior to electrical contacts 100 being shaped.

For example, FIG. 6 depicts sheet 300 from which electrical contacts 100 are to be made. Though sheet 300 is discussed as a sheet of metal herein for purposes of discussion, sheet 300 may be made of any material that is suitable for shaft 102 of electrical contacts 100 for electrically coupling components through socket housing 134. Coating 302A, 302B (hereinafter collectively referred to as "coating 302") is applied to sheet 300. Coating 302 may be applied to sheet 300 at predetermined locations that align with shapes 304A-304G (hereinafter collectively referred to as "shapes 304").

In some examples, shapes 304 may substantially correspond to shaft 102 of electrical contacts 100. In such examples, once shaft 102 is formed from sheet 300, both spring 104 and solder ball 106 may be securely fastened (e.g., fastened in a pseudo-permanent fashion, such as via soldering) to respective shafts 102. In other examples (not depicted), spring 104 (and/or two springs 104, for HLGAs) may also be part of each respective shape 304, such that once shapes 304 are cut from sheet 300 that there is no need to secure springs 104 to respective shafts 102.

Shapes 304 may not be viewable when coating 302 is applied to sheet 300, but rather shapes 304 may be cut (or otherwise removed) from sheet 300 after coating 302 is applied to sheet 300. Though coating 302 is depicted as being applied to only one side of sheet 300, it is to be understood that coating 302 can be applied to either and/or both sides of sheet 300 through any means consistent with this disclosure (such as the means described herein).

Coating 302 may be applied to sheet 300 such that, once shapes 304 are cut from sheet 300, shapes may be folded along seams 306 to become one type of electrical contacts 100A-100E based on what surfaces (if any) of the respective electrical contact 100 was coated. For example, FIG. 7 depicts flowchart 400 of a method of manufacturing electrical contacts 100 with coatings for creating patterns to create a localized capacitance as described herein. Though flowchart 400 is discussed with reference to sheet 300 of FIG. 6 for purposes of clarity, sheet 300 may be used to create other types of electrical contacts 100 according to other methods, and flowchart 400 may be used for creating HLGAs 150 from different types of sheets than sheet 300.

A sheet of conductive material is received (402). The sheet may be a sheet of metal or the like. The material of the sheet defines a first dielectric constant. Coating 302 is applied to sheet 300 (404). Coating 302 may define a second dielectric constant that is higher than the first dielectric constant. Coating 302 may be applied at one or more predetermined locations of sheet 300 that correspond to shapes 304 (which may themselves may be predetermined by a manufacturing device and not visible prior to coating 302 being applied).

Shapes 304 may be cut from sheet 300 (406). Though shapes 304 of sheet 300 are shaped to correspond to electrical contacts 100 depicted herein, shapes 304 may be any shape that is consistent with this disclosure. Shapes 304 may be cut at predetermined locations such that coating 302 is on at least some surfaces of shapes 304. In some examples (not depicted), one or more shapes 304 may be coated with coating 302 after being cut (rather than prior).

Shapes 304 may be folded into the plurality of electrical contacts 100 (408). Some shapes 304 (e.g., such as shapes 304B, 304C, and 304F of sheet 300) may be folded into standard electrical contacts 100A as a result of these shapes 304 not being coated with coating 302, while other shapes 304 (e.g., such as shapes 304A, 304D, 304E, and 304G) may be folded into electrical contacts 100 that include some coating 302 on one or more external surfaces 170 or internal surfaces 172. For example, as depicted, shapes 304A, 304D, 304E, and 304G are folded to create electrical contacts 100E (e.g., as shapes 304A, 304D, 304E, and 304G have coating 302 on select surfaces 170, 172). Shapes 304 may be folded along seams 306 (e.g., which may not be visible but are depicted as dotted lines for purposes of illustration). One or more manufacturing machines as known by one of skill in the art may be configured to extrude, coat, cut, and/or form electrical contacts 100 from sheet 300 in this way.

Electrical contacts 100 as folded are assembled into socket housing 134 to create HLGA 150 (410). Electrical contacts 100 are assembled into socket housing 134 to create a pattern, such as one of patterns 200, 210, 220, 230, or 240. As a result of being folded into this pattern, electrical contacts 100 may generate a localized capacitance as described herein to supplement one or more properties of HLGA 150, therein increasing a performance of HLGA 150.

For example, FIG. 8 depicts results 500A-500C (collectively referred to herein as "results 500") from calculations on aspects of this disclosure in which it was established that a localized capacitance was increased by coating some surfaces of some electrical contacts of an LGA. The calculations were done for HLGAs of different sizes, where a coating was applied via spray or plasma methods onto surfaces prior to contact shape forming.

The calculations were executed with a coating of Barium Titanate (BaTiO3), which can range from defining a dielectric constant (where this dielectric constant, otherwise referred to as a relative permittivity, is represented by Ea) between 1000 and 7000. Results 500A were executed assuming a current design (which is similar to that with electrical contact 100) and a maximum contact area coated with BaTiO3 Ea=1000, while results 500B were executed with a coating of BaTiO3 Ea=3000, and results 500C were executed with a coating of BaTiO3 Ea=7000. As shown in results 500, modulating Ea and a number of contacts resulted in a wide range of capacitance being achieved.

As would be understood by one of ordinary skill in the art, to calculate capacitance, the following equation is used (where C is capacitance, E is the absolute permittivity of the dielectric material, A is area, and d is distance): $C=E_a E_o * A / d$. As used in this calculation, $E_o=8.85E-12$ Farads/minute, and pi=3.14159. To achieve around ~300 picofarads (pF) for a contact body width of 40 thousands of an inch (where a thousandth of an inch is a mil) requires 10 contacts. Results 500 indicate that a proposed contact such as depicted in FIG. 1A with a 20 mil plate width would require 20 contacts to achieve around 300 pF.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A chip component comprising:
    a socket housing made of a first material that defines a first dielectric constant;
    a plurality of electrical contacts that extend through the socket housing to electrically couple a printed circuit board on a first side of the socket housing to a processor on a second side of the socket housing; and
    a coating of a second material that defines a second dielectric constant higher than the first dielectric constant that covers respective surfaces of a subset of the plurality of electrical contacts that are configured to supplement power supply decoupling at a load to provide additional parallel capacitance.

2. The chip component of claim 1, wherein the chip component is a land grid array (LGA).

3. The chip component of claim 1, wherein the chip component is a hybrid land grid array (HLGA).

4. The chip component of claim 1, wherein the coating covers some faces of the subset of the plurality of electrical contacts and does not cover other faces of the subset of the plurality of electrical contacts.

5. The chip component of claim 1, wherein the subset of electrical contacts defines a pattern relative to other electrical contacts of the plurality of electrical contacts within the socket housing, wherein the localized capacitance in the pattern supplements a property of the LGA.

6. The chip component of claim 5, wherein the subset of the plurality of electrical contacts are configured to supplement power supply decoupling at the load to provide additional parallel capacitance as a result of the property.

7. The chip component of claim 6, wherein the pattern comprises:

a first type of electrical contact of the subset of electrical contacts that includes the coating on an outside surface; and a second type of electrical contact of the subset of electrical contacts that includes the coating on an inside surface, wherein the first type of electrical contact is alternated with the second type of electrical contact.

8. The chip component of claim 6, wherein the pattern comprises electrical contacts in which both an outside surface and an inside surface include the coating.

9. The chip component of claim 5, wherein the property includes supplementing overall capacitance for pairs of the plurality of electrical contacts to compensate for inductance.

10. The chip component of claim 9, wherein the pattern includes the coating on some outside faces and some inside faces of the subset of electrical contacts.

11. A land grid array (LGA) comprising:
a socket housing made of a first material that defines a first dielectric constant;
a plurality of electrical contacts that extend through the socket housing; and
a coating of a second material that defines a second dielectric constant higher than the first dielectric constant that covers a subset of the plurality of electrical contacts such that a localized capacitance of the LGA is increased in order to supplement power supply decoupling at a load to provide additional parallel capacitance.

12. The LGA of claim 11, wherein the subset of electrical contacts defines a pattern relative to the other electrical contacts of the plurality of electrical contacts within the socket housing, wherein the localized capacitance in the pattern supplements a property of the LGA.

13. The LGA of claim 12, wherein the property includes the supplement power supply decoupling at the load to provide additional parallel capacitance.

14. The LGA of claim 13, wherein the pattern comprises:
a first type of electrical contact of the subset of electrical contacts that includes the coating on an outside surface; and
a second type of electrical contact of the subset of electrical contacts that includes the coating on an inside surface, wherein the first type of electrical contact is alternated with the second type of electrical contact.

15. The LGA of claim 13, wherein the pattern comprises electrical contacts in which both an outside surface and an inside surface include the coating.

16. The LGA of claim 12, wherein the property includes supplementing overall capacitance for pairs of the plurality of electrical contacts to compensate for inductance.

17. The LGA of claim 16, a first type of electrical contact of the subset of electrical contacts that includes the coating on an outside surface; and
a second type of electrical contact of the subset of electrical contacts that includes the coating on an inside surface, wherein the first type of electrical contact is alternated with the second type of electrical contact.

18. A method comprising:
applying a coating that defines a first dielectric constant to some portion of a sheet of a conductive material that defines a second dielectric constant that is lower than the first dielectric constant;
cutting a plurality of shapes from the sheet of conductive material such that the coating is on some surfaces of the shapes;
folding the plurality of shapes into a plurality of electrical contacts; and
assembling the plurality of electrical contacts into a socket housing of a land grid array (LGA) such that each of the plurality of electrical contacts extend through the socket housing and a localized capacitance of the chip component is increased as a result of the coating on some surfaces of the plurality of electrical contacts.

19. The method of claim 18, wherein:
the coating is applied and the plurality of electrical contacts are cut such that external surfaces of a subset of the plurality of the electrical contacts are substantially entirely coated in the coating; and
the assembling the plurality of electrical contacts into the socket housing includes arranging the subset of electrical contacts among the plurality of electrical contacts to define a pattern to supplement a property of the LGA.

20. The method of claim 18, wherein:
the coating is applied and the plurality of electrical contacts are cut such that select predetermined surfaces of a subset of the plurality of the electrical contacts are coated in the coating; and
the assembling the plurality of electrical contacts into the socket housing includes arranging the subset of electrical contacts among the plurality of electrical contacts to define a pattern to supplement a property of the LGA.

* * * * *